(12) United States Patent
Ellens et al.

(10) Patent No.: US 6,724,142 B2
(45) Date of Patent: Apr. 20, 2004

(54) HIGHLY EFFICIENT FLUORESCENT MATERIAL

(75) Inventors: Andries Ellens, SL Den Haag (NL); Guenter Huber, Schrobenhausen (DE)

(73) Assignee: Patent-Treuhand-Gesellschaft für elektrische Glühlampen mbH, München (DE)

( * ) Notice: Subject to any disclaimer, the term of this patent is extended or adjusted under 35 U.S.C. 154(b) by 72 days.

(21) Appl. No.: 10/062,095

(22) Filed: Jan. 31, 2002

(65) Prior Publication Data
US 2002/0105269 A1 Aug. 8, 2002

(30) Foreign Application Priority Data

Feb. 7, 2001 (DE) .......................... 101 05 800

(51) Int. Cl.$^7$ ................................. H01J 1/62
(52) U.S. Cl. ............ 313/512; 252/301.4; 313/484; 313/485; 313/486; 313/487
(58) Field of Search ............... 252/301.4; 313/484–487, 313/512

(56) References Cited

U.S. PATENT DOCUMENTS

| 6,165,631 A | 12/2000 | Boerner et al. | |
|---|---|---|---|
| 2003/0020101 A1 * | 1/2003 | Bogner et al. | ............ 25/233 |
| 2003/0024438 A1 * | 2/2003 | Botty et al. | ............ 106/481 |

FOREIGN PATENT DOCUMENTS

| EP | 1 104 799 A1 | 6/2001 |
|---|---|---|
| WO | 98/39807 | 9/1998 |

OTHER PUBLICATIONS

T. Schlieper et al; Nitrido–silicate II [1]Hochtemperatur–Synthesen und Kristallstrukturen von $Sr_2Si_5N_8$ und $Ba_2Si_5\,N_8$ ; Zeitschrift für anorganische und allgemeine Chemie; 1995; pp. 1380–1384; Germany.

* cited by examiner

Primary Examiner—Ashok Patel
Assistant Examiner—Holly Harper
(74) Attorney, Agent, or Firm—Frishauf, Holtz, Goodman & Chick, P.C.

(57) ABSTRACT

Fluorescent material from the class of the silicide nitrides, Sr being used as cation, and the suicide nitrides being doped with trivalent Ce.

7 Claims, 4 Drawing Sheets

US 6,724,142 B2

HIGHLY EFFICIENT FLUORESCENT MATERIAL

FIELD OF THE INVENTION

The invention proceeds from a fluorescent material from the class of the silicide nitrides in accordance with the preamble of claim 1. In particular these are silicide nitrides which fluoresce in the yellow region.

BACKGROUND OF THE INVENTION

Fluorescent materials of the silicide nitride type such as $Sr_2Si_5N_8$ and $Ba_2Si_5N_8$, already known from the article by Schlieper, Millus and Schlick: Nitridosilicate II, Hochtemperatursynthesen and Kristallstrukturen von $Sr_2Si_5N_8$ und $Ba_2Si_5N_8$ [Silicide nitrides II, high-temperature syntheses and crystal structures of $Sr_2Si_5N_8$ and $Ba_2Si_5N_8$], Z. anorg. allg. Chem. 621, (1995), page 1380. However, in this case no activators are specified which would suggest efficient emission in specific regions of the visible spectrum.

SUMMARY OF THE INVENTION

It is an object of the present invention to provide a flourescent material from the class of the suicide nitrides having a cation and the basic formula $A_xSi_yN_z$, the efficiency of which is as high as possible, and which can be effectively stimulated by UV radiation in the region of 370 to 430 nm.

This and other objects are attained in accordance with one aspect of the invention directed to a highly efficient fluorescent material from the class of the silicide nitrides having a cation and the basic formula $A_xSi_yN_z$, characterized in that Sr is used as cation, the silicide nitride being doped with trivalent Ce which acts as activator.

There is as yet no yellow-emitting fluorescent material of high efficiency which can be effectively stimulated in the region around 400 nm. The well known, normally used fluorescent material YAG:Ce can admittedly be effectively stimulated below 370 m and above 430 nm, but not in the region around 400 nm. Other Ce-doped garnets also exhibit only a slight ability to be stimulated in the range of use in question. It was therefore necessary to develop a completely different system.

According to the invention, the composition of the fluorescent material is selected such that it constitutes an Sr silicide nitride that is activated with trivalent Ce. The previously unknown fluorescent material $Sr_2Si_5N_8:Ce^{3+}$ absorbs efficiently in the near UV, in particular in the region of 370 to 430 nm, and has an efficient yellow luminescence. It is preferably activated by 1 to 10 mol % Ce (for Sr). In this case, the Sr can be replaced partially (advantageously up to at most 30 mol %) by Ba and/or Ca. A further embodiment constitutes a silicide nitride of the type $SrSi_7N_{10}:Ce^{3+}$. In this case, too, the Sr can be replaced partially by Ba and/or Ca.

This fluorescent material is particularly well suited as a yellow component for stimulation by a primary UV radiation source such as, for example, a UV LED, or else a lamp. It is possible thereby to implement a light source emitting either in the white or yellow regions, as described similarly in WO 98/39807. A yellow-emitting light source is based on a LED primarily emitting UV radiation whose radiation is converted entirely into yellow light by a fluorescent material according to the invention.

In particular, this fluorescent material can be used in conjunction with a UV-LED (for example of the type InGaN), which generates white light by means of fluorescent materials emitting in the blue and yellow regions. Candidates for the blue component are known per se; for example, $BaMgAl_{10}O_{17}Eu^{2+}$ (known as BAM) or $Ba_5SiO_4(Cl,Br)_6 Eu^{2+}$ or $CaLA_2S_4Ce^{3+}$ or else $(Sr,Ba,Ca)_5(PO_4)_3Cl:Eu^{2+}$ (known as SCAP). A red fluorescent material can be used, in addition, in order to improve the color of this system. $(Y,La,Gd,Lu)_2O_2S:Eu^{3-}$, $SrS:Eu^{2+}$ or else $Sr_2Si_5N_8:Eu^{2+}$ (not yet published, see EP-A 99 123 747.0) are particularly suitable.

BRIEF DESCRIPTION OF THE DRAWINGS

The aim below is to explain the invention in more detail with the aid of two exemplary embodiments. In the drawing.

DETAILED DESCRIPTION OF THE DRAWINGS

Figure 1:
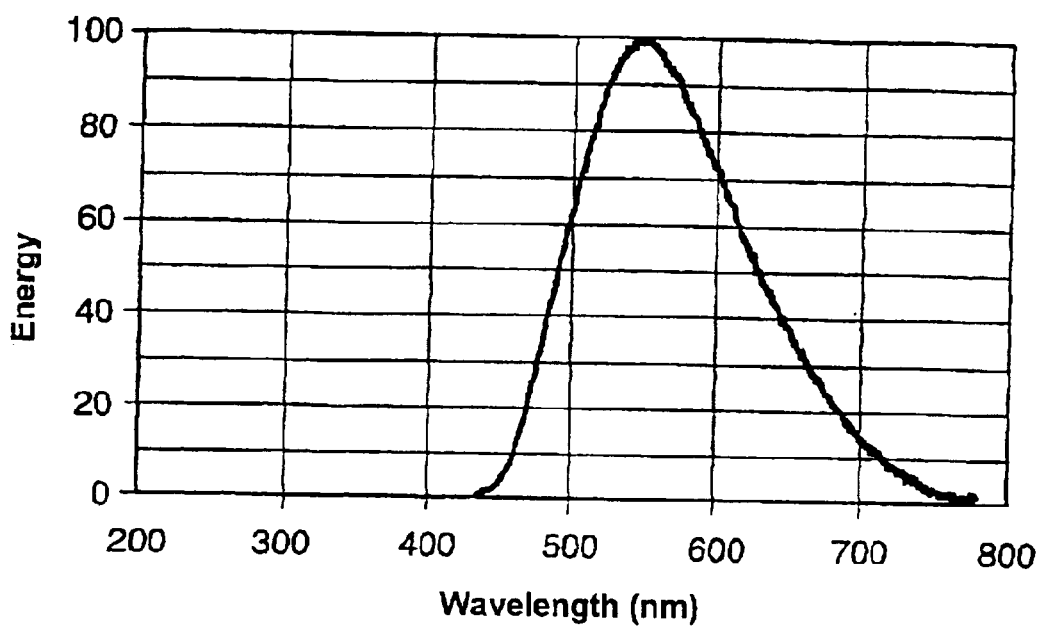
FIG. 1 shows an emission spectrum of a first silicide nitride.

A concrete example of the fluorescent material according to the invention is shown in FIG. 1, which concerns the emission of the fluorescent material, $Sr_2Si_5N_8:Ce^{2+}$, the Ce proportion amounting to 4 mol % of the lattice sites occupied by Sr. The emission maximum is at 545 nm, and the mean wavelength at 572 nm. The color locus is x=0.395;y=0.514. The stimulation is performed at 400 nm.

The production is performed in the usual way, the starting materials $Sr_3N_2$, $Si_3N_4$ and $CeO_2$ being mixed with one another, and the mixture subsequently being baked in a furnace over 5 hours in a reducing fashion under $N_2$ and $H_2$ at 1400° C.

Figure 2:
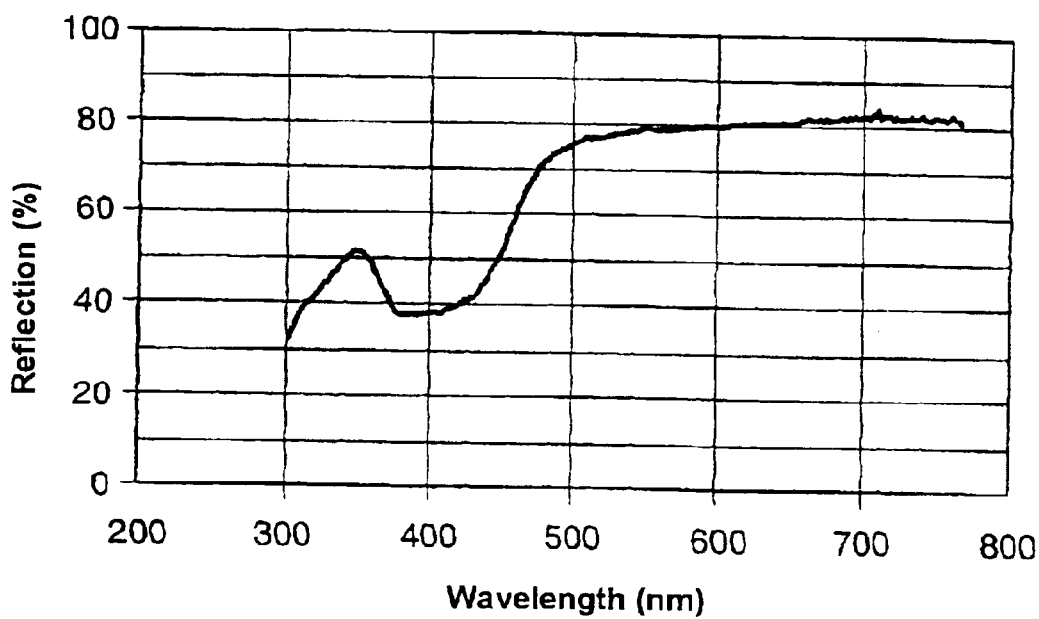
FIG. 2 shows the reflection spectrum of this silicide nitride.

FIG. 2 shows the diffuse reflection spectrum of this fluorescent material. It exhibits a pronounced minimum in the region of 370 to 440 nm, which thereby demonstrates a good ability to be stimulated in this region.

Figure 3:
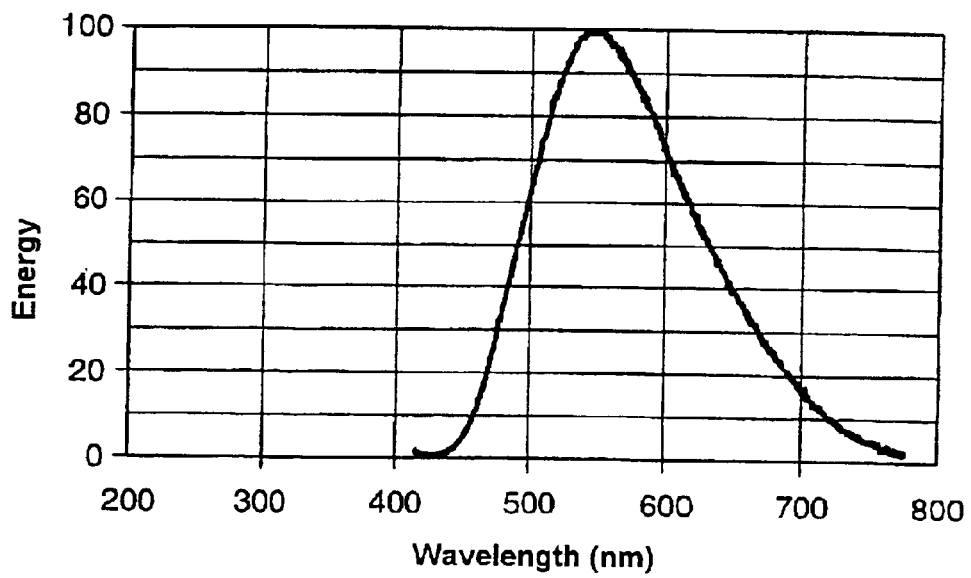
FIG. 3 shows an emission spectrum of a second silicide nitride.

A second example of the fluorescent material according to the invention is shown in FIG. 3, which concerns emission of the fluorescent material $Sr_2Si_5N_8:Ce^{2+}$, the Ce proportion amounting to 8 mol % of the lattice sites occupied by Sr. The emission maximum is at 554 nm, the mean wavelength at 579 nm. The color locus is x=0.414;y=0.514.

The production is performed in the above described way, the mixture being baked in the oven over 6 hours in a reducing fashion under $N_2$ at 1400° C.

Figure 4:
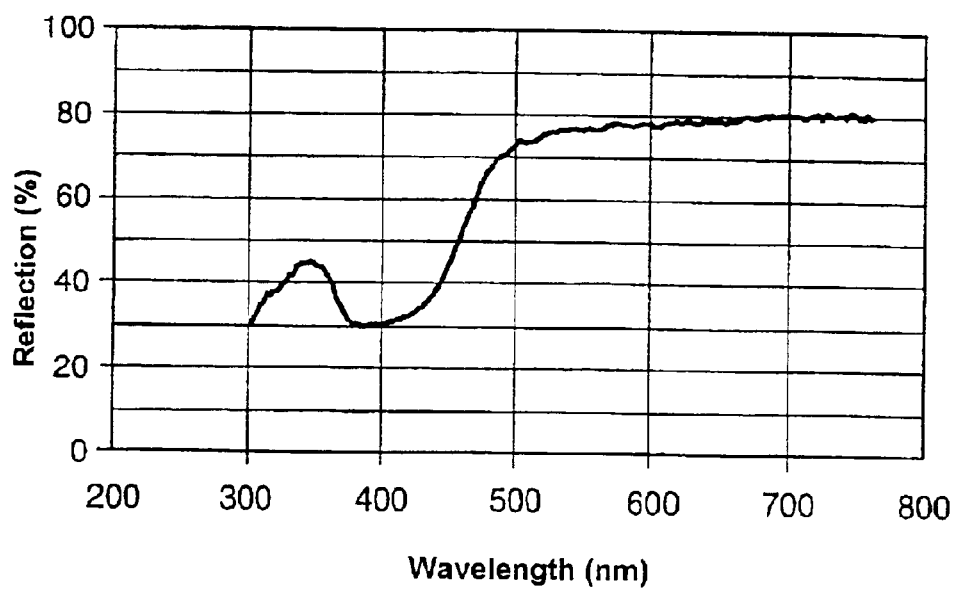
FIG. 4 shows the reflection spectrum of this silicide nitride.

FIG. 4 shows the diffuse reflection spectrum of this fluorescent material. It exhibits a pronounced minimum in the region of 370 to 440 nm, which therefore demonstrates a good ability to be stimulated in this region.

Figure 5:
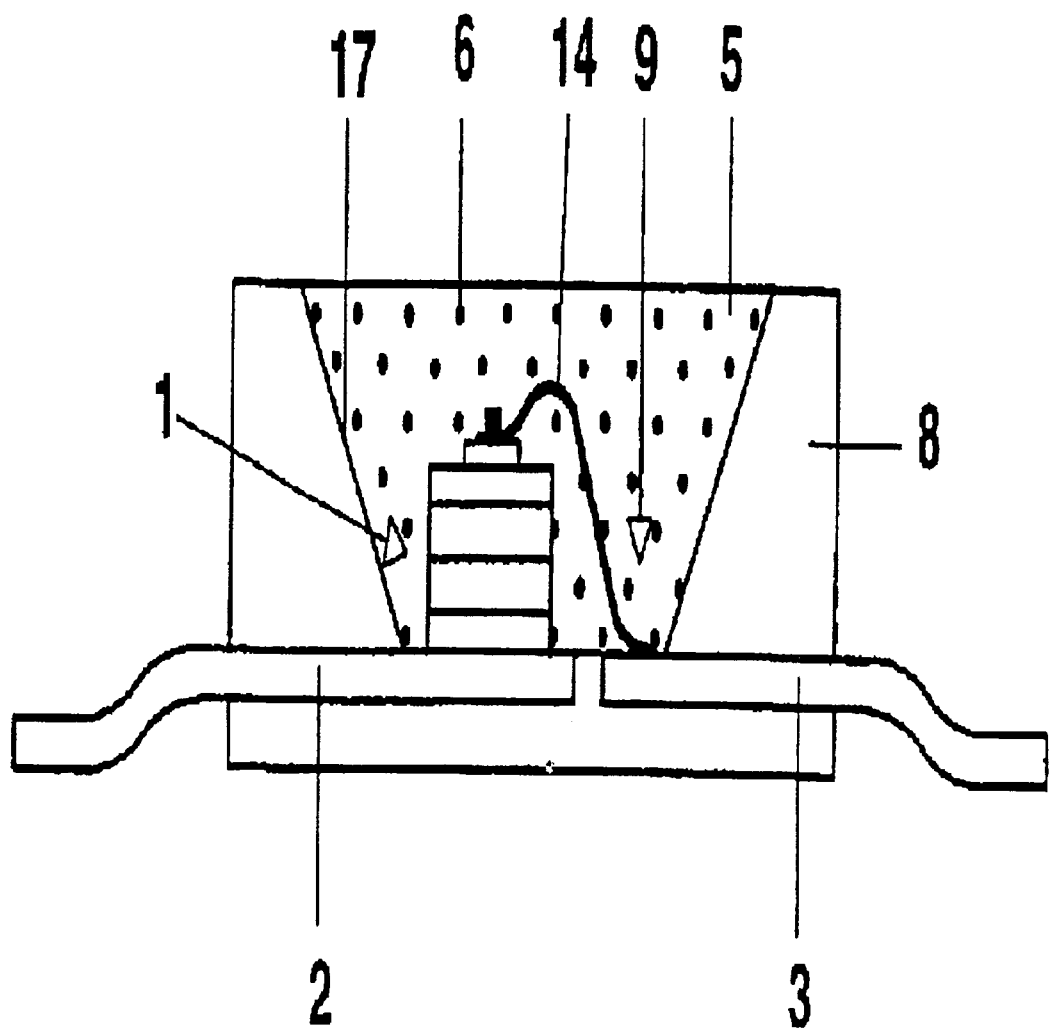
FIG. 5 shows a semiconductor component which serves as light source for white light.

The design of a light source of white light is shown explicitly in FIG. 5. The light source is a semiconductor component with a chip 1 of type InGaN having a peak emission wavelength of, for example, 390 nm, which is embedded in an opaque basic housing 8 in the region of a cut-out 9. The chip 1 is connected via a bond wire 14 to a first terminal 3, and directly to a second electric terminal 2.

The cut-out 9 is filled with a potting compound 5 which contains as main constituents an epoxy casting resin (80 to 90% by weight, and fluorescent pigments 6 (less than 15% by weight). A first fluorescent material is the silicide nitride presented as a first exemplary embodiment, while the second is a fluorescent material emitting in the blue region, here $Ba_5SiO_4(Cl,Br)_6:Eu^{2+}$ in particular. The cut-out has a wall 17 which serves as reflector for the primary and secondary radiation of the chip 1 or the pigments 6. The combination of the blue and yellow secondary radiation mixes to produce white.

Figure 6:
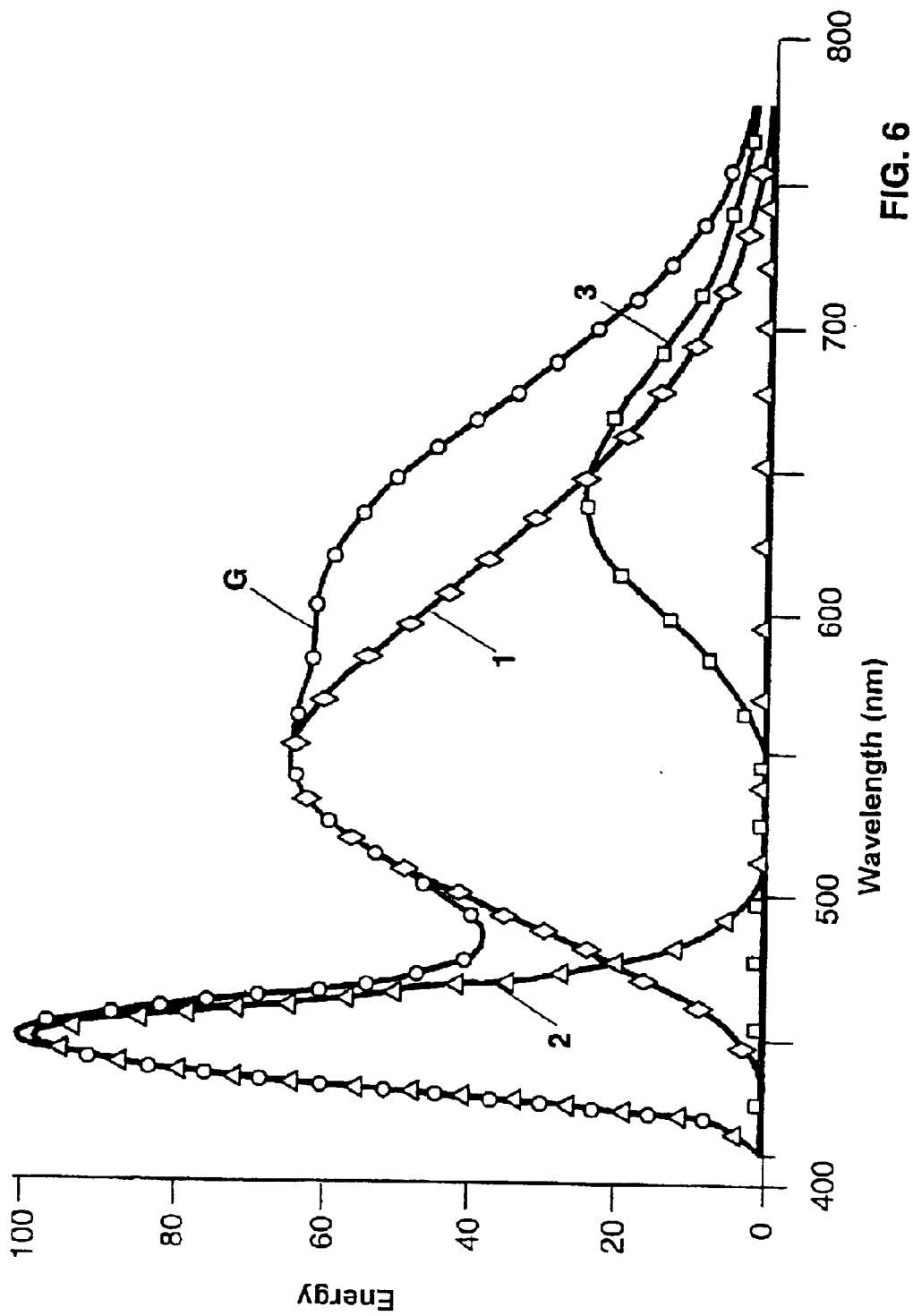
FIG. 6 shows an emission spectrum of a mixture of three fluorescent materials.

In a further exemplary embodiment, a mixture of three fluorescent materials is used as fluorescent pigment. A first fluorescent material (1) is the yellow-emitting silicide nitride $Sr_2Si_5N_8:Ce^{2+}$ presented as the first exemplary embodiment, the second (2) is the blue-emitting fluorescent material of the abovementioned SCAP, and the third (3) is a red-emitting fluorescent material of type $Sr_2Si_5N_8:Eu^{2+}$. FIG. 6 shows the emission spectrum of such an LED with primary emission at 375 nm, the individual components of yellow (1), blue (2) and red (3) adding together to form an overall spectrum (G) which conveys a white color sensation of high quality. The associated color locus is x=0.333 and y=0.331. The use of three components ensures a particularly good color rendition.

What is claimed is:

1. A highly efficient fluorescent material from the class of the silicide nitrides having a cation and the basic formula $A_xSi_yN_z$, characterized in that the fluorescent material is $Sr_2Si_5N_8:Ce^{3+}$ or $SrSi_7N_{10}:Ce^{3+}$.

2. The fluorescent material as claimed in claim 1, characterized in that the proportion of the Ce amounts to between 1 and 10 mol % of the Sr.

3. The fluorescent material as claimed in claim 1, 30 mol %, is replaced by Ba and/or Ca.

4. A light source having a primary radiation source, which emits radiation in the shortwave region of the optical spectral region in the wavelength region of 370 of 430 nm, this radiation being converted wholly or partially into secondary radiation of longer wavelength in the visible spectral region by means of a first fluorescent material as claimed in claim 1.

5. The light source as claimed in claim 4, characterized in that a light-using diode based on InGaN is used as primary radiation source.

6. The light source as claimed in claim 4, characterized in that a portion of the primary radiation continues to be converted into radiation of longer wavelength by means of a second fluorescent material, the first and second fluorescent materials being, in particular, suitably selected and mixed in order to generate white light.

7. The light source as claimed in claim 6, characterized in that a portion of the primary radiation continues to be converted into radiation of longer wavelength by means of a third fluorescent material, this third fluorescent material emitting in the red spectral region.

* * * * *

UNITED STATES PATENT AND TRADEMARK OFFICE
CERTIFICATE OF CORRECTION

PATENT NO. : 6,724,142 B2
DATED : April 20, 2004
INVENTOR(S) : Ellens et al.

It is certified that error appears in the above-identified patent and that said Letters Patent is hereby corrected as shown below:

<u>Column 4,</u>
Line 4, after "claim 1," insert -- characterized in that part of the Sr, in particular up to --.

Signed and Sealed this

Sixteenth Day of August, 2005

JON W. DUDAS
*Director of the United States Patent and Trademark Office*